(12) United States Patent
Lin

(10) Patent No.: US 11,114,441 B1
(45) Date of Patent: Sep. 7, 2021

(54) SEMICONDUCTOR MEMORY DEVICE

(71) Applicant: NANYA TECHNOLOGY CORPORATION, New Taipei (TW)

(72) Inventor: Shian-Jyh Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/072,017

(22) Filed: Oct. 15, 2020

(51) Int. Cl.
  *H01L 27/108* (2006.01)
  *H01L 23/64* (2006.01)
  *H01L 23/522* (2006.01)

(52) U.S. Cl.
  CPC .... *H01L 27/10814* (2013.01); *H01L 23/5222* (2013.01); *H01L 23/5223* (2013.01); *H01L 23/642* (2013.01); *H01L 27/10805* (2013.01); *H01L 27/10808* (2013.01)

(58) Field of Classification Search
  CPC ............. H01L 23/5222; H01L 23/5223; H01L 23/642; H01L 27/101; H01L 27/1052; H01L 27/108; H01L 27/10805; H01L 27/10808; H01L 27/10814
  USPC ....... 257/296, 298, 300, 306, 308, 311, 532, 257/535
  See application file for complete search history.

(56) References Cited

U.S. PATENT DOCUMENTS

| | | | |
|---|---|---|---|
| 5,998,846 A * | 12/1999 | Jan ..................... | H01L 27/0207 257/296 |
| 10,211,282 B2 * | 2/2019 | Lee .................... | H01L 28/90 |
| 2007/0001203 A1 | 1/2007 | Lehr et al. | |
| 2009/0039465 A1 * | 2/2009 | Chinthakindi ...... | H01L 23/5223 257/532 |
| 2013/0062733 A1 * | 3/2013 | Summerfelt ...... | H01L 27/11509 257/532 |
| 2015/0364474 A1 * | 12/2015 | Kang .................. | G11C 11/5635 257/306 |
| 2016/0240475 A1 * | 8/2016 | Park .................... | H01L 23/564 |
| 2019/0378556 A1 * | 12/2019 | Lim .................... | G11C 5/063 |

* cited by examiner

*Primary Examiner* — Matthew E Warren
(74) *Attorney, Agent, or Firm* — CKC & Partners Co., LLC

(57) ABSTRACT

A semiconductor memory device includes a substrate, a plurality of landing pads, a first conducting layer, a plurality of first capacitors, a plurality of second capacitors, a second conducting layer and a plurality of third capacitors. The substrate has an active area, and the active area has a first area, a second area and a third area. The third area surrounds the first area. The second area surrounds the first area and the third area. The landing pads are disposed on the first area. The first conducting layer is disposed on the second area. The first capacitors are disposed on the landing pads respectively. The second capacitors are disposed on the first conducting layer. The second conducting layer is disposed on the second capacitors. The third capacitors are disposed in the third area. The second conducting layer is not electrically connected to the third capacitors.

10 Claims, 7 Drawing Sheets

SEMICONDUCTOR MEMORY DEVICE

BACKGROUND

Field of Invention

The present invention relates to semiconductor device. More particularly, the present disclosure relates to semiconductor memory device.

Description of Related Art

According to an increase of a degree of integration of a semiconductor memory device, such as dynamic random access memory (DRAM), demands for high storage capacity and high operation speed of the semiconductor memory device have increased. Also, the semiconductor memory device may include capacitors providing various functions.

When the degree of integration of the semiconductor memory device is increased, the number of operation circuits may be proportionally increased, and noise may be generated in and external power voltage VDD and a ground voltage VSS during read and write operations.

SUMMARY

Accordingly, the present disclosure provides a semiconductor memory device with power decoupling capacitors.

According to an embodiment of the present disclosure, a semiconductor memory device includes a substrate, a plurality of landing pads, a first conducting layer, a plurality of first capacitors, a plurality of second capacitors, a second conducting layer and a plurality of third capacitors. The substrate has an active area, and the active area has a first area, a second area and a third area. The third area surrounds the first area. The second area surrounds the first area and the third area. The landing pads are disposed on the first area. The first conducting layer is disposed on the second area. The first capacitors are disposed on the landing pads respectively. The second capacitors are disposed on the first conducting layer. The second conducting layer is disposed on the second capacitors. The third capacitors are disposed in the third area. The second conducting layer is not electrically connected to the third capacitors.

In an embodiment of the disclosure, the second conducting layer includes a first connecting area. The first connecting area is located above the second capacitors. A power supply is electrically connected to first conducting layer or the second conducting layer.

In an embodiment of the disclosure, the second conducting layer includes a second connecting area. The second connecting area is connected to the first connecting area. The second conducting layer in the second connecting area is extended along a direction perpendicular to a contacting surface of the active area.

In an embodiment of the present disclosure, the first conducting layer is formed on the same level as the landing pads in the first area.

In an embodiment of the present disclosure, the second capacitors are connected in parallel.

In an embodiment of the present disclosure, the substrate includes a first insulating layer and a plurality of bit lines. The bit lines are located below the first insulating layer in the first area.

In an embodiment of the present disclosure, the substrate includes a plurality of contact structures, and the landing pads are disposed on the contact structures respectively. Top surfaces of the contact structures and top surfaces of the first insulating layer are at the same level.

In an embodiment of the present disclosure, bottoms of the contact structures and bottoms of the bit lines are at the same level.

In an embodiment of the present disclosure, a second insulating layer is disposed on the second area, and the second capacitors are disposed in the second insulating layer. The second conducting layer covers the second insulating layer in the second area.

In an embodiment of the present disclosure, the second area includes a plurality of sub-areas, and a plurality of gaps is located among the sub-areas, and each of the sub-areas accommodates some of the second capacitors.

With the above-mentioned configuration of the second capacitors, noise from a power may be reduced, and the second capacitors may be used as a low pass filter for removing noise.

The foregoing has outlined rather broadly the feature and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purpose of the present disclosure. It should also be realized by those skilled in the art that such equivalent constructions do not depart from the spirit or scope of the disclosure as set forth in the appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
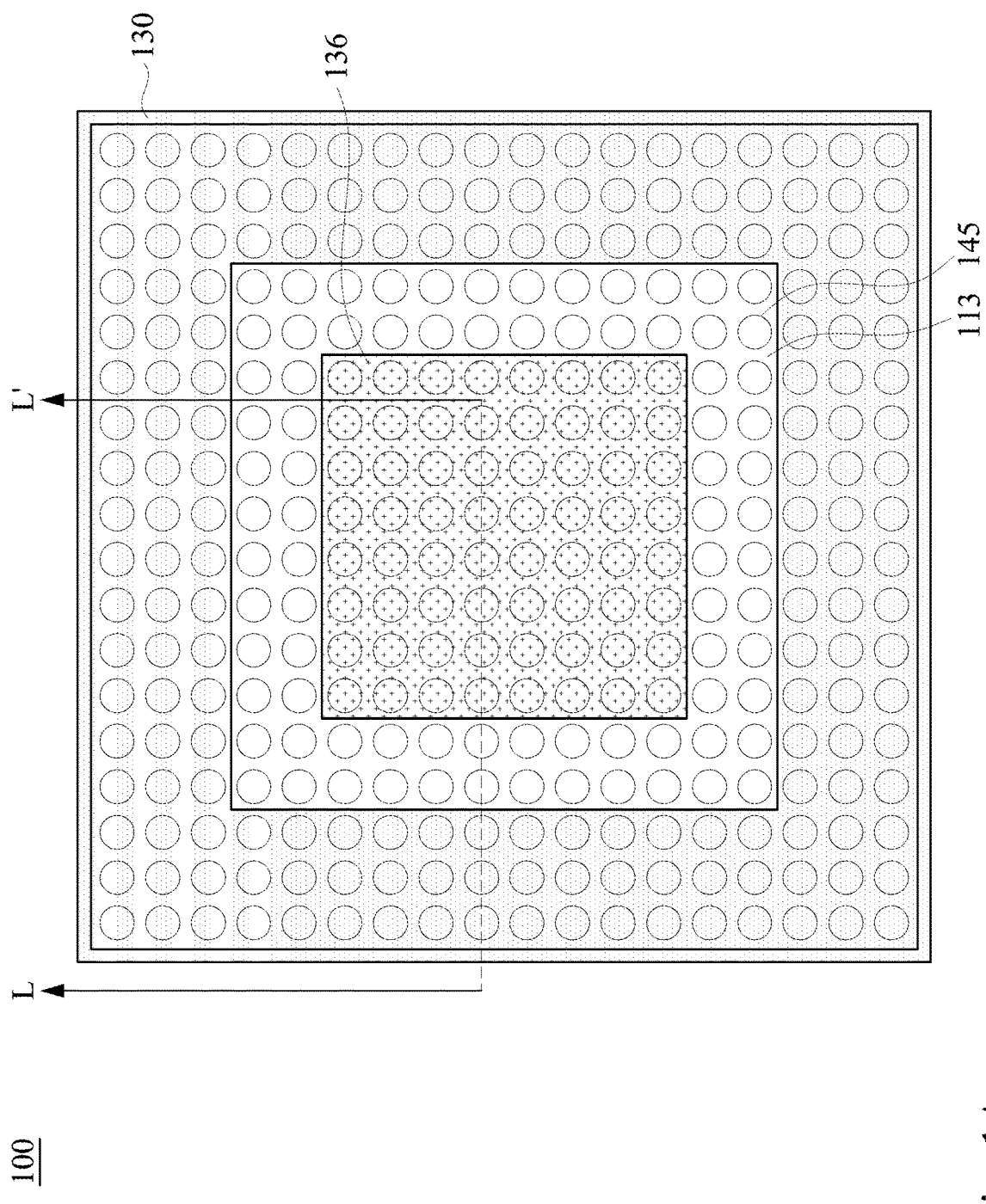
FIG. 1A is a schematic top view of a semiconductor memory device according to one embodiment of this invention.

Reference will now be made in detail to the present embodiments of the invention, examples of which are illustrated in the accompanying drawings. Wherever possible, the same reference numbers are used in the drawings and the description to refer to the same or like parts.

Referring to the drawings, the illustrated thickness of the layers and regions may be exaggerated to facilitate explanation. When a first layer is referred to as being "on" a second layer or "on" a substrate, it could mean that the first layer is formed directly on the second layer or the substrate, or it could also mean that a third layer may exist between the first layer and the second layer or the substrate.

It shall be understood that, although the terms first, second, third, etc. may be used herein to describe various elements, components, regions, layers, or sections, these elements, components regions, layers, or sections are not limited by these terms. Rather, these terms are merely used to distinguish one element, component, region, layer, or section from another region, layer or section. Thus, a first element, component, region, layer, or section discussed below could be termed a second element, component, region, layer, or section without departing from the teachings of the present disclosure.

The terminology used herein for the purpose of describing particular embodiments only and is not intended to be limited to the present disclosure concept. As used herein, the singular forms "a", "an" and "the" are intended to include the plural forms as well, unless the context clearly indicates otherwise. It shall be further understood that the terms "comprises" and "comprising", when used in the specification, point out the presence of stated features, integers, steps, operations, elements, or components, but do not preclude the presence or addition of one or more other features, integers, steps, operations, elements, components, or groups thereof.

As used herein, the terms "patterning" and "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch or other removal process. The mask can be a photoresist, or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

Figure 1B:
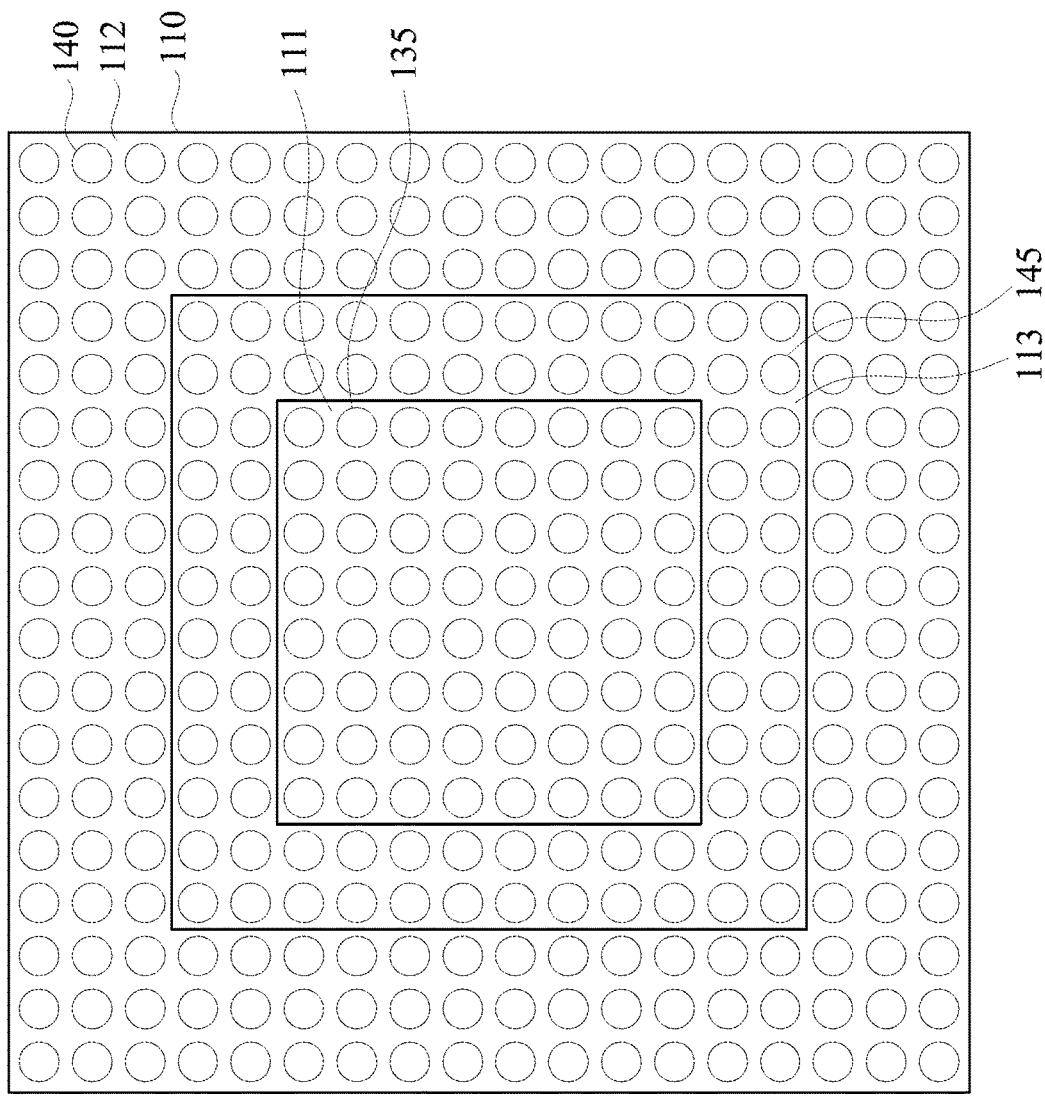
FIG. 1B is a simplified top view of the semiconductor memory device of FIG. 1A.

Reference is made by FIGS. 1A and 1B. FIG. 1A is a schematic top view of a semiconductor memory device 100 according to one embodiment of this invention. FIG. 1B is a simplified top view of the semiconductor memory device 100 of FIG. 1A. To simplify, a central conducting layer 136 located in a first area 111, a second conducting layer 130 and a first conducting layer 125 with a contact 126 located in the second area 112 are not illustrated in FIG. 1B.

As illustrates in FIGS. 1A and 1B, in this embodiment, the semiconductor memory device 100 includes a substrate 110. As shown in FIG. 1B, the substrate 110 includes an active area having a first area 111, a second area 112 and a third area 113. In some embodiments, the substrate 110 can include a plurality of transistors within the active area. The second area 112 surrounds the first area 111. The third area 113 is located between the first area 111 and the second area 112.

Specifically, in this embodiment, shape of the first area 111 is square, and shape of the contour of the second area 112 is a square ring.

As shown in FIG. 1B, the semiconductor memory device 100 further includes a plurality of first capacitors 135, a plurality of second capacitors 140 and a plurality of third capacitors 145. The first capacitors 135, the second capacitors 140 and the third capacitors 145 are respectively located in the first area 111, the second area 112 and third area 113. In other words, the first capacitors 135 are surrounded by the second capacitor 140.

In this embodiment, the first capacitors 135 and the second capacitors 140 are decoupled. Specifically, in this embodiment, a plurality of transistors is formed within the first area 111 of the active area of the substrate 110 and respectively connected to the first capacitors 135 to form memory cells, and the second capacitors 140 are electrically decoupled to the first capacitors 135. The decoupled second capacitors 140 surrounds the first capacitors 135 such that the noise effect and the current base supply drop of the first capacitors 135 can be reduced. In other words, the noise effect and the current base supply drop for the memory cells formed on the substrate 110 can also be reduced. The second capacitor 140 electrically isolates the first capacitors 135 from other circuits beyond the substrate 110. For details, please refer to the following discussions.

Return to FIG. 1A. In this embodiment, the semiconductor memory device 100 further includes a second conducting layer 130 in the second area 112 and the central conducting layer 136 in the first area 111. Therefore, in this embodiment, the second capacitors 140 are connected in parallel. The second conducting layer 130 is located on top surfaces of the second capacitors 140 and connects the second capacitors 140 to have the same voltage. Similarly, the central conducting layer 136 is located on top surfaces of the first capacitors 135 and connects the first capacitors 135 to have the same voltage. Therefore, electric signal stored in the memory cells formed by the first capacitors 135 can be further stable.

In this embodiment, there is no conducting layer formed on top surfaces of the third capacitors 145, which are located in the third area 113 surrounding the first area 111, and the third capacitors 145 are not connected to each other. The first capacitors 135, the second capacitors 140 and the third capacitors 145 can be formed in one manufacturing process. When forming the first capacitors 135, the second capacitors 140 and the third capacitors 145, it facilitates the execution of the etch process for capacitor manufacturing.

As shown in FIG. 1, the first capacitors 135, the second capacitors 140 and the third capacitors 145 are arranged in different straight rows parallel to each other. However, the arrangement of the first capacitors 135, the second capacitors 140 and the third capacitors 145 are not limited to FIG. 1. In some embodiments, the first capacitors 135, the second capacitors 140 and the third capacitors 145 are arranged in a hexagonal form.

In this embodiment, the first capacitors 135, the second capacitors 140 and the third capacitors 145 are not electrically connected to each other, and the third capacitors 145 are used to ensure that the second capacitors 140 are decoupled to the first capacitors 135.

Figure 2:
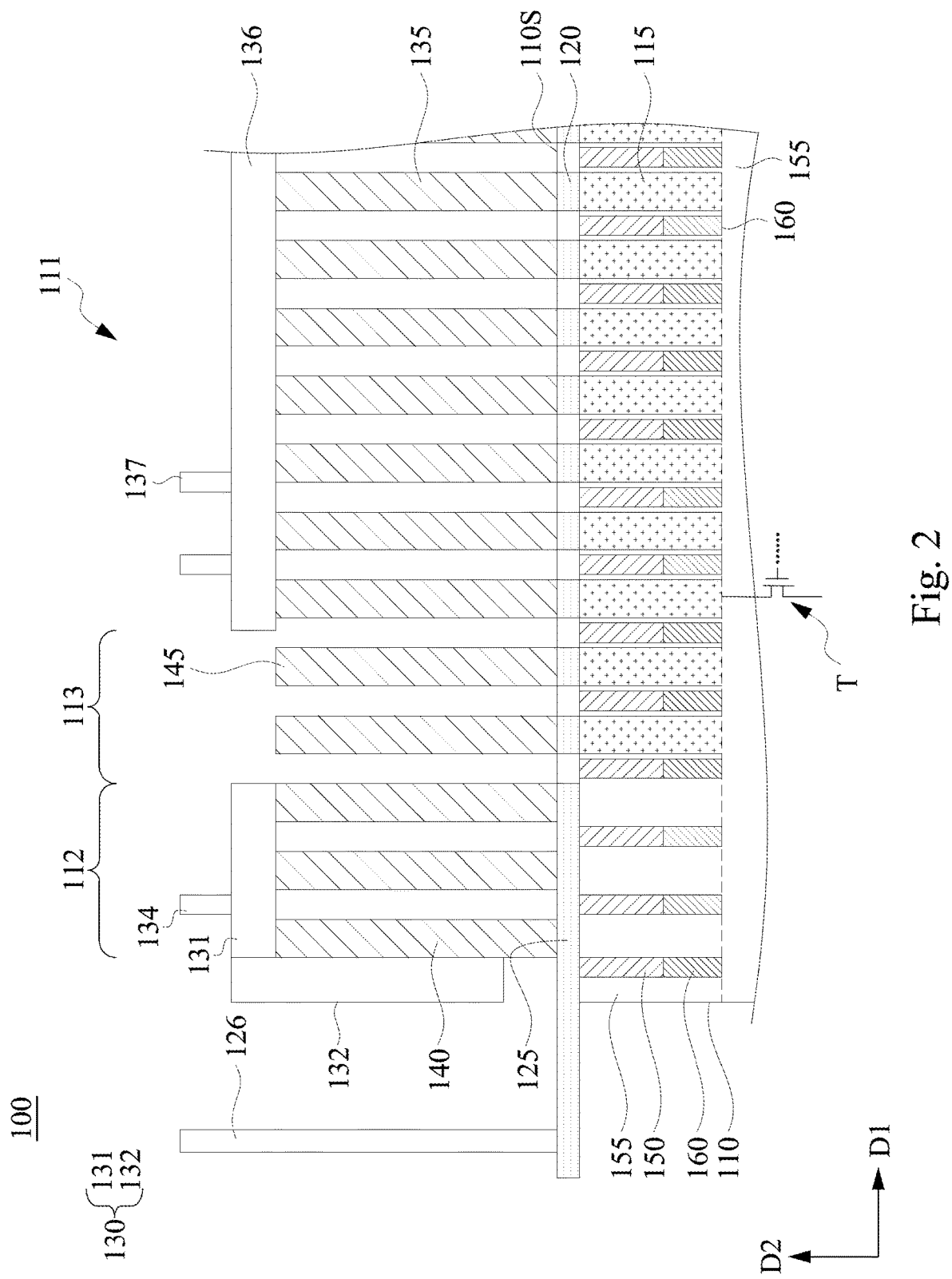
FIG. 2 is a cross-section view of the semiconductor memory device of FIG. 1A along a line L-L'.

Reference is made by FIG. 2. FIG. 2 is a cross-section view of the semiconductor memory device of FIG. 1A along a line L-L'.

As illustrated in FIG. 2, the semiconductor memory device 100 includes the substrate 110 including the active area having the first area 111, the second area 112 and the third area 113. The first area 111 is surrounded by the third area 113 and the second area 112 in order. In other words, the second area 112 can be regard as a close loop surrounding the first area 111. The first capacitors 135, the second capacitors 140 and the third capacitors 145 are respectively located in the first area 111, the second area 112 and third area 113. In other words, the first capacitors 135 are surrounded by the third capacitors 145 and the second capacitors 140. The top surfaces of the third capacitors 145 are open.

The active area of the substrate 110 includes a contacting surface 110S. The semiconductor memory device 100 includes a plurality of landing pads 120 and a first conducting layer 125 upon the contacting surface 110S. The landing pads 120 are located in the first area 111 and the third area 113. The first capacitors 135 are respectively connected to the landing pads 120. The first conducting layer 125 is located on the second area 112. The first conducting layer 125 extends along the direction D1. The second capacitors 140 are connected to the first conducting layer 125. In this embodiment, the first conducting layer 125 may be formed on the same level as the landing pads 120 on the first area 111, and of the same material.

The semiconductor memory device 100 further includes contact structures 115, a first insulating layer 150, a second insulating layer 155 and bit lines 160. In FIG. 2, the second insulating layer 155 is under the contacting surface 110S. The contact structures 115, the first insulating layer 150 and the bit lines 160 are located within the second insulating layer 155.

The contact structures 115 and the bit lines 160 are electrically isolated. In some embodiments, air isolation dielectrics are located between the contact structures 115 and the bit lines 160 to electrically isolate the contact structures 115 and the bit lines 160.

In the first area 111, the contact structures 115 are respectively connected to the landing pads 120 on the contacting surface 110S. The landing pads 120 in the first area 111 are located between the first capacitors 135 and the contact structures 115. Specifically, the contact structures 115 are connected to transistors below, and the first capacitor 135 are respectively connected to the transistors through landing pads 120 and contact structures 115. The transistors are formed within the substrate 110 and under the contact structures 115. To simplify, only one transistor T of the transistors located below the contact structures 155 is illustrated schematically, and the one transistor T in FIG. 2 is connected to one of the contact structures 115. Therefore, the below transistors T within the substrate 110 and the first capacitors 135 located on the contact surface 110S form memory cells. The central conducting layer 136 is located on top surfaces of the first capacitors 135 and connects the first capacitors 135 to have the same voltage. Therefore, electric signal stored in the memory cells formed by the first capacitors 135 and transistors below can be further stable.

As shown in FIG. 2, in this embodiment, top surfaces of the contact structures 115 and top surfaces of the first insulating layer 155 are aligned. In this embodiment, the top surfaces of the contact structures 115, the top surfaces of the first insulating layer 155 and the contacting surface 110S are at the same level. Further, bottoms of the contact structures 115 and bottoms of the bit lines 160 are at the same level.

Under the contacting surface 110S and between the contacting structures 115, the first insulating layer 150 and the bit lines 160 in the first area 111 are within the second insulating layer 155. The bit lines 160 are located below the first insulating layer 150 in the first area 111. The first insulating layers 150 respectively cover the bit lines 160.

In FIG. 2, the contacting surface 110S extends along a first direction D1, and the first capacitors 135 extends along a second direction D2. In this embodiment, the first direction D1 is perpendicular to the second direction D2.

The contacts 137 are located on the central conducting layer 136, and users can provide a voltage through the contacts 137.

In the second area 112, there is no contact structure under the contacting surface 110S, thereby the second capacitors 140 in the second area are decoupled to the first capacitors 135. In this embodiment, the second capacitors 140 extend along the second direction D2. The second capacitors 140 are connected in parallel.

As shown in FIG. 2, the second conducting layer 130 includes a first connecting area 131 and a second connecting area 132. The first connecting area 131 is located above the second capacitors 140. The second connecting area 132 is connected to the first connecting area 131. The second conducting layer 130 in the second connecting area 132 is extended along the second direction D2 perpendicular to the first direction D1 in which the contacting surface 110S extends. In this embodiment, the second conducting area 132 of the second conducting layer 130 contacts a side of a second capacitor 140 to be supported.

As shown in FIG. 2, in this embodiment, a contact 126 extends along the second direction D2 is formed on the first conducting layer 125, the power supply can be connected the first conducting layer 125 through the contact 126.

The contacts 134 are located on the second conducting layer 130, and users can provide a voltage through the contacts 134. In some embodiments, a power supply is electrically connected to the second conducting layer 130 through the contact 134. In some embodiments, a power supply is electrically connected to the second connecting area 132 of the second conducting layer 130.

The third area 113 surrounds the first area 111. The second area 112 surrounds the third area 113. A plurality of third capacitors 145 is located in the third area 113. Under the contacting surface 110S, there are contacting structures 115, first insulating layer 150 and bit lines 160 below, and the contacting structures 115 connected to the third capacitors 145 through landing pads 120. However, there is no conducting layer connecting the third capacitors 145 together to have the same voltage. Therefore, the third capacitors 145 can be regarded as dummy capacitors used to further decouple the first capacitors 135 and the second capacitors 140.

In some embodiment, material of the first insulating layer 150 includes SiN.

In some embodiment, material of the landing pads 120 and the first conducting layer 125 includes tungsten or TiN.

In some embodiment, material of the first capacitors 135, the second capacitors 140 and the third capacitors 145 includes high-K dielectric material.

Therefore, as shown in FIG. 2, the semiconductor memory device 100 includes the memory cells formed by the first capacitors 135 and transistors surrounded by the decoupling second capacitors 140.

In some embodiments, there are some filling materials filled in the spacing of the first capacitors 135, the second capacitors 140 and the third capacitors 145. For illustrative purposes, the filling materials are omitted in Figures. In some embodiments, the filling materials include dielectric material.

Figure 3B:
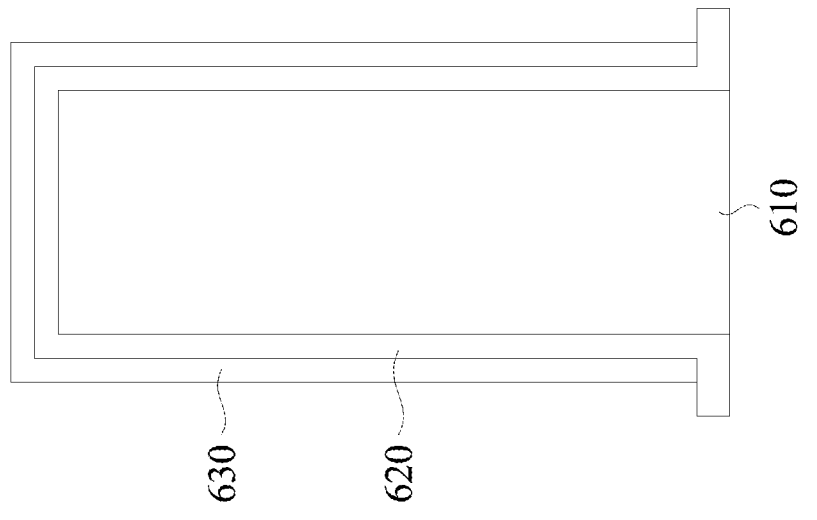
FIG. 3B is a schematic cross-section view of a capacitor according to one embodiment of this invention.
Figure 3A:
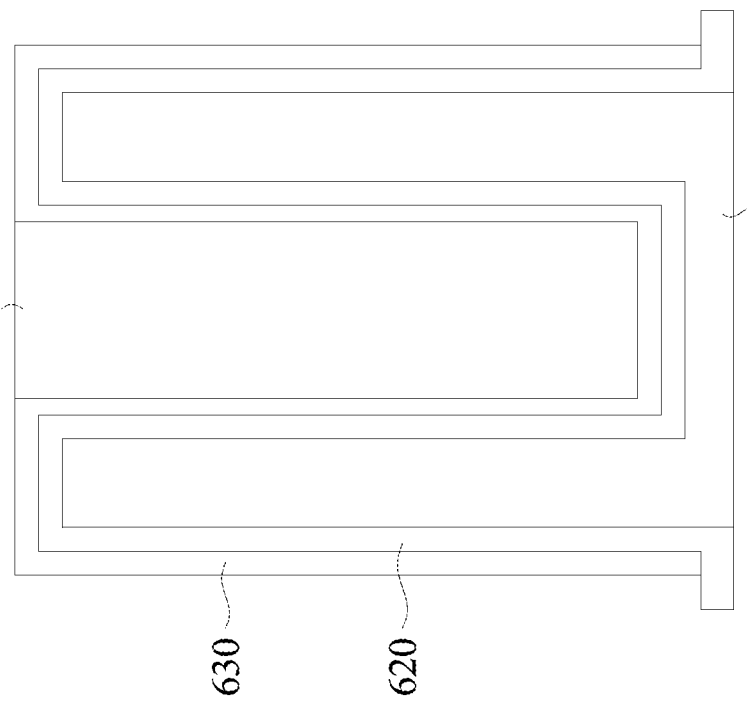
FIG. 3A is a schematic cross-section view of a capacitor according to one embodiment of this invention.

Reference is made by FIGS. 3A and 3B. FIG. 3A is a schematic cross-section view of a capacitor 600A according to one embodiment of this invention. FIG. 3B is a schematic cross-section view of another capacitor 600B according to one embodiment of this invention. In some embodiments, the first capacitors 135, the second capacitors 140 and the third capacitors 145 can be capacitors 600A or 600B but not limited. The capacitors 600A or 600B can be a capacitor unit structure for the first capacitors 135, the second capacitors 140 and the third capacitors 145.

As shown in FIG. 3A, a capacitor 600A include a bottom electrode 610, a high-K dielectric 620, a top electrode 630 and a conductive material 640. The bottom 610 of the capacitor 600A is a U-shaped container. The high-K dielectric 620 with an M-shape covers the bottom electrode 610. The top electrode 630 with an M-shaped further covers the high-K dielectric 620, and the high-K dielectric 620 is located between the bottom electrode 610 and the top electrode 630. The M-shape top electrode 630 forms an accumulating space and the conductive material 640 located in the accumulating space formed by the top electrode 630.

When the capacitors 600A are used to be the first capacitors 135, the second capacitors 140 and the third capacitors 145, the bottom electrode 610 of each of the capacitors 600A is electrical connected to the landing pads 120 in the first area 111 or the first conducting layer 125 in the second area 112, and the top electrode 630 and the conductive material 640 of each capacitors 600A are electrically connected to the central conducting layer 136 in the first area 111 or the first connecting area 131 of the second conducting layer 130 in the second area 112. For example, when the capacitor 600A is used as a first capacitor 135 in the first area 111, the bottom electrode 610 is connected to one corresponding one of the landing pads 120, and the top electrode 630 and the conductive material 640 are connected to the central conducting layer 136. When the capacitors 600A are used as the second capacitors 140 in the second area 112, the bottom electrodes 610 are connected to the same first conducting layer 125, and the top electrodes 630 and the conductive material 640m are connected to the first conducing area 131 of the second conducting layer 130.

Therefore, through the high-K dielectric 620 located between the bottom electrode 610 and the top electrode 630, the capacitor 600A can store charges after applying electric voltage difference between the bottom electrode 610 and the top electrode 630.

FIG. 3B illustrates another capacitor 600B. As shown in FIG. 3B, the capacitor 600B includes a columnar bottom electrode 610, a high-K dielectric 620 and a top electrode 630. The high-K dielectric 620 covers the columnar bottom electrode 610, and the top electrode 630 further covers the high-K dielectric 620. The high-K dielectric 620 is located between the bottom electrode 610 and the top electrode 630. Similarly, the capacitor 600B can store charges after applying electric voltage difference between the bottom electrode 610 and the top electrode 630.

When the capacitors 600B are used to be the first capacitors 135, the second capacitors 140 and the third capacitors 145, the bottom electrode 610 of each of the capacitors 600B is electrical connected to the landing pads 120 in the first area 111 or the first conducting layer 125 in the second area 112, and the top electrode 630 of each capacitors 600B are electrically connected to the central conducting layer 136 in the first area 111 or the first connecting area 131 of the second conducting layer 130 in the second area 112. For example, when the capacitor 600B is used as a first capacitor 135 in the first area 111, the bottom electrode 610 is connected to one corresponding one of the landing pads 120, and the top electrode 630 and the conductive material 640 are connected to the central conducting layer 136. When the capacitors 600B are used as the second capacitors 140 in the second area 112, the bottom electrodes 610 are connected to the same first conducting layer 125, and the top electrodes 630 are connected to the first conducing area 131 of the second conducting layer 130.

Figure 4:
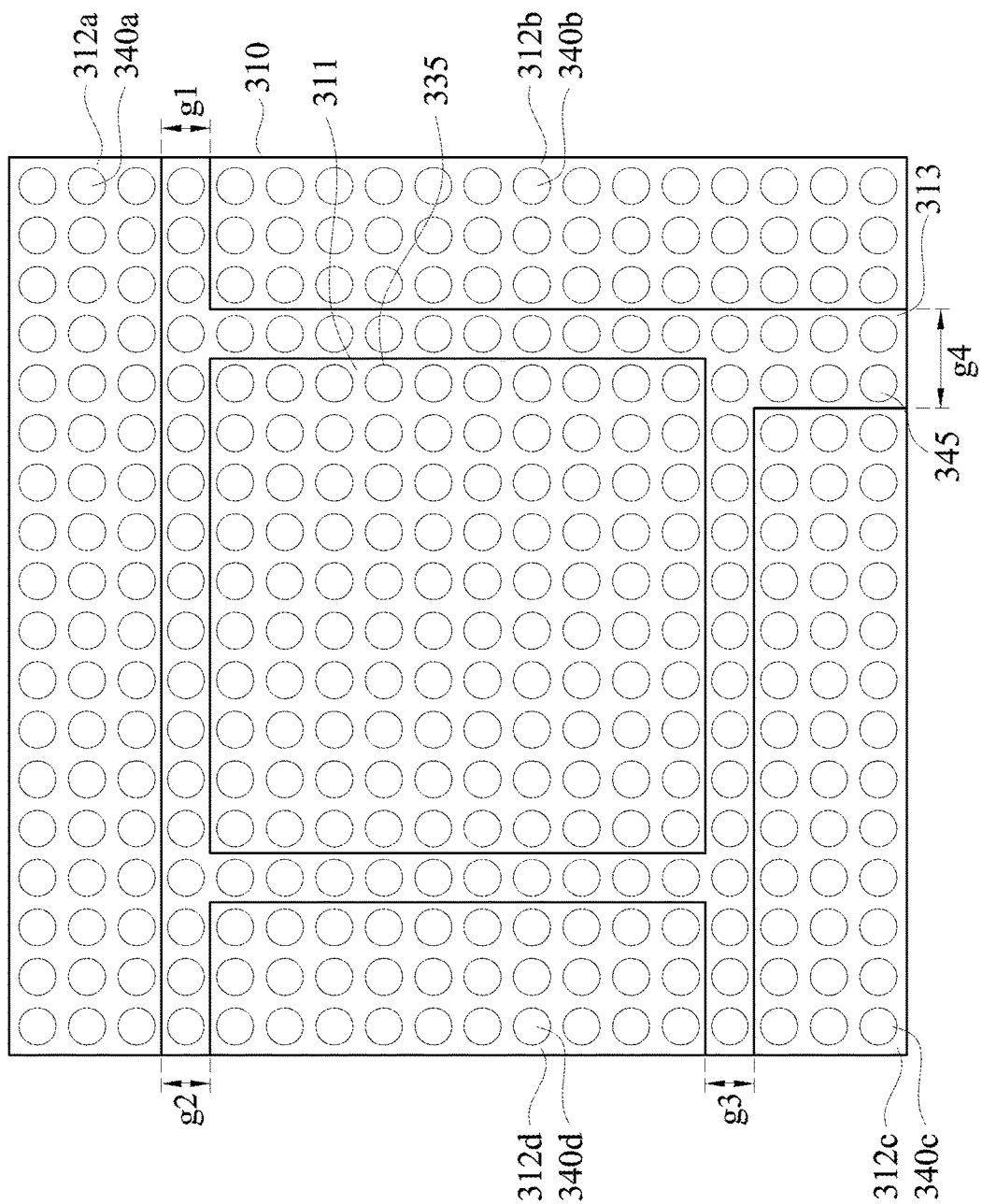
FIG. 4 is a schematic top view of a semiconductor memory device according to another embodiment of this invention.

Reference is made by FIG. 4. FIG. 4 is a schematic top view of a semiconductor memory device 300 according to another embodiment of this invention.

Similar to FIG. 3, in FIG. 4, the semiconductor memory device 300 includes substrate 310. However, the difference between the semiconductor memory device 300 of FIG. 4 and the semiconductor memory device 100 in FIGS. 1A and 1B is that the shape of the second area 312 surrounding the first area 311 and the third area 313. The third area 313 is located between the first area 311 and the second area 312. The substrate 310 of the semiconductor memory device 300 includes an active area including a first area 311 and, a second area 312 and a third area 313. The second area 312 includes four sub-areas 312a, 312b, 312c and 312d. The third area 313 is located between the area 311 and the sub-areas 312a, 312b, 312c and 312d.

A plurality of capacitors is located on the substrate 310 of the semiconductor memory device 300. A plurality of the first capacitors 335 is located on the first area 311.

A plurality of the second capacitors 340 is located on the second area 312. Each of the sub-areas 312a, 312b, 312c and 312d accommodates some of the second capacitors 340, and shapes of the sub-areas 312a, 312b, 312c and 312d are rectangle. Specifically, the second capacitors 340 includes capacitors 340a, 340b, 340c and 340d respectively located on the sub-areas 312a, 312b, 312c and 312d. Similarly, the second capacitors 340 including the capacitors 340a, 340b, 340c and 340d are electrically decoupled to the first capacitors 335. Therefore, the decoupled capacitors 340a, 340b, 340c and 340d surround the first capacitors 335 to avoid noise effect.

A plurality of gaps is located among the sub-areas 312a, 312b, 312c and 312d. As shown in FIG. 4, a gap g1 is between the square sub-areas 312a and 312b, a gap g2 is between the square sub-areas 312a and 312d, a gap g3 is between the square sub-areas 312c and 312d and a gap g4 is between the square sub-areas 312k and 312G. Each of sub-areas 312a, 312b, 312c and 312d is adjacent one side of the square first area 311.

In this embodiment, the first capacitors 335 are connected to each other through a conducting layer (similar to the central conducting layer 136 in FIG. 2) upon. For second area 312, the second capacitors 340 (e.g., capacitors 340a, 340b, 340c and 340d) in the same sub-area (e.g., sub-areas 312a, 312b, 312c and 312d) are connected to each other thorough a corresponding conducting layer (similar to the second conducting layer 125 in FIG. 2). To simplify, the conducting layers used to connect capacitors are not shown in FIG. 4.

A plurality of third capacitors 345 is located in the third area 313. Similarly, there is no conducting layer configured on the third capacitors 313, and the third capacitors 313 are not conductive. Therefore, the first capacitors 335 and the second capacitors 340 are electrically isolated.

In some embodiments, the semiconductors 100 and 300 can be formed by following operations.

First, an active area is formed on a substrate, and active devices including word lines and bit lines can be formed in the active area.

Then, define first, second and third areas of the active area (e.g., the first area 111, the second area 112 and the third area 113 shown in FIG. 2), landing pads are formed in the first area and a first conducting layer (e.g., a bottom cell plated)

is formed on the second area, and capacitors are formed on the active areas and isolated with the bit lines.

After the capacitors are formed, a top cell plate is formed to cover the first, second and third areas, and the top cell plate is divided into a first conducting layer (e.g., the first conducting layer 131 in FIG. 2) in the second area and a conducting layer (e.g. central conducting layer 136 in FIG. 2) in the first area. The portion of the top cell plate in the third area is removed, thereby isolating the capacitors in the second area and the capacitors in the first area. In some embodiments, the portion of the top cell plate in the third area can be removed through a lithography process and an etching process. The capacitors in the second area can be regard as decoupling capacitors.

Then, contacts are formed on the divided top cell plate.

Finally, metal wire can be formed for the decoupling capacitor connection with power management or regulator. The metal wire (not shown) is connected to, for example, the contact 126 shown in FIG. 2.

For the semiconductor structure 300, a top cell plate can be formed to cover all of the first area 311, the second area 312 including sub-areas 312a, 312b, 312c and 312d and the third areas 313. Then, the portion of the top cell plated corresponding to the third area 313 is removed through a lithography process and an etching process, and the decoupling sub-areas 312a, 312b, 312c and 312d of the second areas 312 and the active first area 311 are defined.

Figure 5:
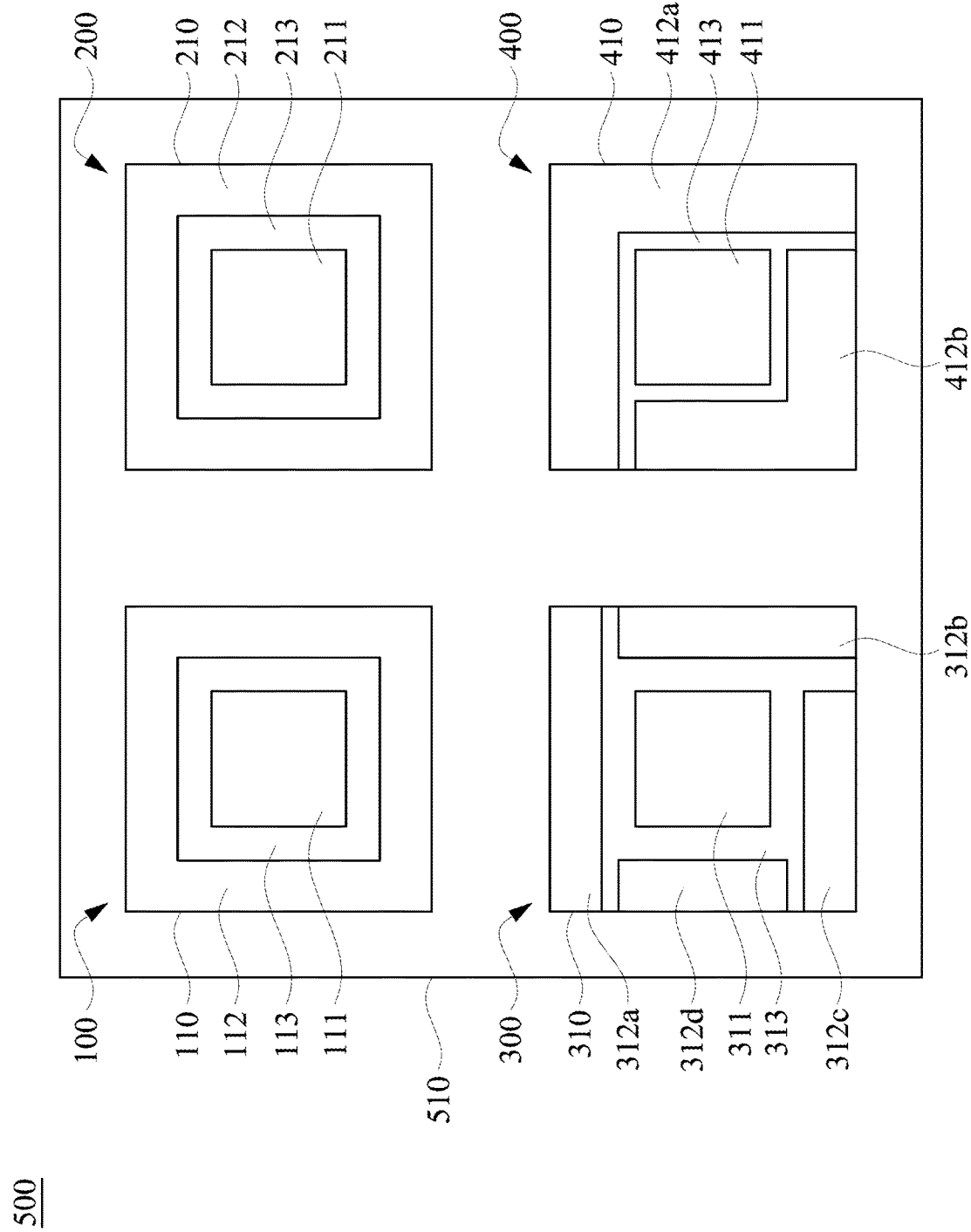
FIG. 5 is a semiconductor structure according to one embodiment of this invention.

Reference is made by FIG. 5. FIG. 5 is a semiconductor structure 500 according to one embodiment of this invention.

As shown in FIG. 5, the semiconductor structure 500 includes a substrate 510 and semiconductor memory devices 100, 200, 300 and 400. The semiconductor memory devices 100, 200, 300 can be regarded as memory chips located on the 510. In other words, the substrate 510 can be regarded as the common substrate of the semiconductor memory devices 100, 200, 300 and 400. To simplify, the capacitors on the semiconductor memory devices 100, 200, 300 and 400 are not shown in FIG. 5. As mentioned above, the semiconductor memory device 100 includes a first area 111, a second area 112, and a third area 113. The semiconductor memory device 200 similar to the semiconductor structure 100 includes a first area 211 and a second area 212. The semiconductor memory devices 300 includes a first area 311, a second area 312 having square sub-areas 312a, 312b, 312c and 312d and a decoupled third area 313. Similar to the semiconductor memory devices 300, the semiconductor memory device 400 includes a first area 411, a second area 412 having L-shaped sub-areas 412a and 412b and a decoupled third area 413.

The four semiconductor memory devices 100, 200, 300 and 400 are integrated on the substrate 510, and the semiconductor structure 500 can be regarded as an integrated memory device. Connecting circuits used to connect capacitors in different semiconductor memory devices 100, 200, 300 and 400 can be formed within the substrate 510. To simplify, the connecting circuits are not shown in FIG. 5.

Figure 6B:
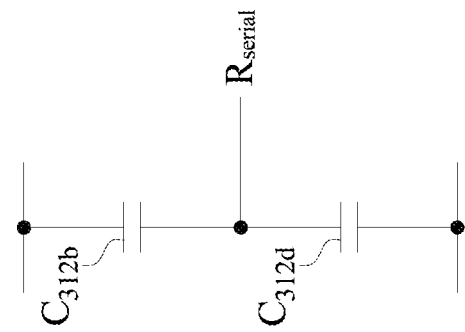
FIGS. 6A and 6B illustrate schematic partial equivalent circuits in FIG. 5.
Figure 6A:
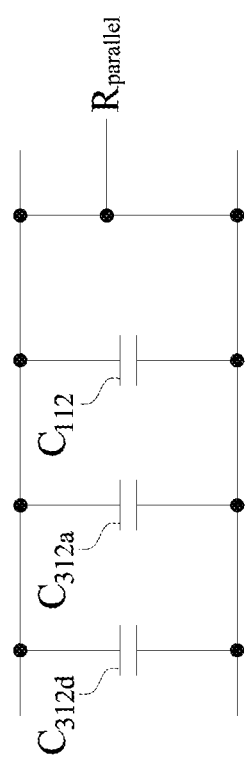

In some embodiments, some of the second areas (e.g., second areas 112, 212 and sub-areas 312a-312d and 412a, 412b) in different semiconductor memory devices 100, 200, 300 and 400 can be connected to each other. Please refer to FIGS. 6A and 6B. FIGS. 6A and 6B illustrate schematic partial equivalent circuits in FIG. 5.

As shown in FIG. 6A, the second area 112 and sub-areas 312a, 312d can be connected to each other through the connecting circuits within the substrate 510. In this embodiment, the second area 112 and sub-areas 312a, 312d are equivalently connected in parallel. The equivalent capacitance of the second area 112 is $C_{112}$, the equivalent capacitance of the sub-area 312a is $C_{312a}$, and the equivalent capacitance of the sub-area 312d is $C_{312d}$. The equivalent capacitances $C_{312a}$ and $C_{312d}$ are connected in parallel with an equivalent resistance $R_{parallel}$.

In FIG. 6B, the sub-areas 312b and 312c can be connected to each other through the connecting circuits within the substrate 510. The equivalent capacitance of the sub-area 312b is $C_{312b}$, and the equivalent capacitance of the sub-area 312c is $C_{312c}$. The equivalent capacitances $C_{312b}$ and $C_{312c}$ are connected in series with an equivalent resistance $R_{serial}$.

In some embodiments, the second capacitors in the second areas 112, 212, 312a-312d and 412a, 412b can be used in series or in parallel with other independent decoupling capacitors, thereby reducing the occupied area of the power decoupling second capacitors in the second areas 112, 212, 312a-312d and 412a, 412b to reduce the chip area of the semiconductor structures 100, 200, 300 and 400.

In summary, with the above-mentioned configuration of the decoupling second capacitors surrounding the first capacitors used to form memory cells, noise from a power may be reduced, and the second capacitors may be used as a low pass filter for removing noise.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor memory device, comprising:
   a substrate having an active area, wherein the active area has a first area, a second area and a third area, the third area surrounds the first area, the second area surrounds the first area and the third area;
   a plurality of landing pads disposed on the first area;
   a first conducting layer disposed on the second area;
   a plurality of first capacitors disposed on the landing pads respectively;
   a plurality of second capacitors disposed on the first conducting layer;
   a second conducting layer disposed on the second capacitors; and
   a plurality of third capacitors disposed in the third area, wherein the second conducting layer is not electrically connected to the third capacitors.

2. The semiconductor memory device of claim 1, wherein the second conducting layer comprises a first connecting area located above the second capacitors, and a power supply is electrically connected to the first conducting layer or the second conducting layer.

3. The semiconductor memory device of claim 2, wherein the second conducting layer comprises a second connecting area connected to the first connecting area, and the second conducting layer in the second connecting area is extended along a direction perpendicular to a contacting surface of the active area.

4. The semiconductor memory device of claim 1, wherein the first conducting layer is formed on the same level as the landing pads in the first area.

5. The semiconductor memory device of claim 1, wherein the second capacitors are connected in parallel.

6. The semiconductor memory device of claim 1, wherein the substrate comprises a first insulating layer and a plurality of bit lines and the bit lines are located below the first insulating layer in the first area.

7. The semiconductor memory device of claim 6, wherein the substrate comprises a plurality of contact structures, the landing pads are disposed on the contact structures respectively, and top surfaces of the contact structures and top surfaces of the first insulating layer are at the same level.

8. The semiconductor memory device of claim 7, wherein bottoms of the contact structures and bottoms of the bit lines are at the same level.

9. The semiconductor memory device of claim 1, wherein a second insulating layer is disposed on the second area, the second capacitors are disposed in the second insulating layer, and the second conducting layer covers the second insulating layer in the second area.

10. The semiconductor memory device of claim 1, wherein the second area comprises a plurality of sub-areas, a plurality of gaps are located among the sub-areas, each of the sub-areas accommodates some of the second capacitors.

* * * * *